US011656643B2

(12) United States Patent
Delshadpour et al.

(10) Patent No.: US 11,656,643 B2
(45) Date of Patent: May 23, 2023

(54) CAPLESS LOW DROPOUT REGULATION

(71) Applicant: NXP USA, Inc., Austin, TX (US)

(72) Inventors: Siamak Delshadpour, Phoenix, AZ (US); Xueyang Geng, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 72 days.

(21) Appl. No.: 17/302,785

(22) Filed: May 12, 2021

(65) Prior Publication Data
US 2022/0365549 A1    Nov. 17, 2022

(51) Int. Cl.
G05F 1/575 (2006.01)
G01R 19/165 (2006.01)
(Continued)

(52) U.S. Cl.
CPC ....... G05F 1/575 (2013.01); G01R 19/16538 (2013.01); G05F 1/461 (2013.01);
(Continued)

(58) Field of Classification Search
CPC .......... G05F 1/462; G05F 1/465; G05F 1/468; G05F 1/56; G05F 1/575; G05F 1/562;
(Continued)

(56) References Cited

U.S. PATENT DOCUMENTS 5,952,851 A * 9/1999 Yuen ................ H03K 19/01714
326/88
6,177,785 B1 * 1/2001 Lee ........................ G05F 3/247
323/349
(Continued)

FOREIGN PATENT DOCUMENTS

CN       112732000 A       4/2021
WO    WO-2020204820 A1 *  10/2020 ............ G05F 1/563

OTHER PUBLICATIONS

Choi et al., A quasi-digital ultra-fast capacitorless low-dropout regulator based on a comparator control for x8 current spike of PCRAM systems, Jun. 22, 2018, Symposium on VLSI circuits Digest of Technical Papers, p. 108-108 (Year: 2018).*

(Continued)

*Primary Examiner* — Thienvu V Tran
*Assistant Examiner* — Nusrat Quddus

(57) ABSTRACT

A circuit for converting a first voltage to a second voltage in a communication system is disclosed. The circuit includes a pass transistor including a first terminal, a second terminal and a gate, wherein the first terminal is coupled with the first voltage. The circuit is also includes an error amplifier. The error amplifier includes a first input that is coupled with a constant reference voltage and a second input that is coupled with a first switch that is coupled with an output port. A second switch is included and is coupled between the first voltage and an output of the error amplifier. The output of the error amplifier is coupled with the gate of the pass transistor. A third switch is included and is coupled between ground and the output of the error amplifier. The second switch is configured to be driven by a first one shot pulse generated from an input signal of the communication system and the third switch is configured to be driven by a second one shot pulse generated from the input signal.

19 Claims, 3 Drawing Sheets

(51) Int. Cl.
  *G05F 1/46* (2006.01)
  *G05F 1/565* (2006.01)
  *G05F 3/30* (2006.01)
  *G06F 1/26* (2006.01)
(52) U.S. Cl.
  CPC ............. *G05F 1/565* (2013.01); *G05F 3/30* (2013.01); *G06F 1/266* (2013.01)
(58) Field of Classification Search
  CPC .......... G05F 1/565; G05F 1/567; G05F 1/569; G05F 1/571; G05F 1/573; G05F 1/5735
  See application file for complete search history.

(56) References Cited

U.S. PATENT DOCUMENTS

| | | | |
|---|---|---|---|
| 6,414,537 B1* | 7/2002 | Smith | G05F 1/468 |
| | | | 327/540 |
| 7,068,019 B1* | 6/2006 | Chiu | H03F 3/45475 |
| | | | 323/273 |
| 7,459,886 B1* | 12/2008 | Potanin | H02J 7/0068 |
| | | | 320/135 |
| 7,782,036 B1* | 8/2010 | Wong | H02M 3/156 |
| | | | 323/282 |
| 8,436,595 B2 | 5/2013 | Simmons et al. | |
| 9,529,374 B2* | 12/2016 | Enjalbert | G05F 1/575 |
| 9,753,476 B1* | 9/2017 | Shukla | G05F 1/562 |
| 9,778,672 B1* | 10/2017 | Gao | G05F 1/575 |
| 9,886,049 B2* | 2/2018 | Qing | G05F 1/575 |
| 9,933,802 B1* | 4/2018 | Jeong | G01R 31/40 |
| 10,146,240 B1* | 12/2018 | Wang | G05F 3/242 |
| 10,317,921 B1* | 6/2019 | Shen | G05F 1/565 |
| 11,249,530 B1* | 2/2022 | Pal | G06F 1/305 |
| 2003/0178976 A1* | 9/2003 | Xi | G05F 1/575 |
| | | | 323/273 |
| 2005/0046405 A1* | 3/2005 | Trafton | G05F 1/56 |
| | | | 323/308 |
| 2005/0122751 A1* | 6/2005 | Zeng | H02M 3/07 |
| | | | 363/50 |
| 2007/0241728 A1 | 10/2007 | Demolli | |
| 2007/0252564 A1* | 11/2007 | De Nisi | H02M 3/07 |
| | | | 323/268 |
| 2008/0180074 A1* | 7/2008 | Einerman | G05F 1/575 |
| | | | 323/280 |
| 2009/0033310 A1* | 2/2009 | Erbito, Jr. | G05F 1/56 |
| | | | 327/143 |
| 2009/0322295 A1* | 12/2009 | Scoones | G05F 1/56 |
| | | | 323/282 |
| 2010/0013449 A1* | 1/2010 | Miki | G05F 1/56 |
| | | | 323/282 |
| 2010/0259235 A1* | 10/2010 | Ozalevli | G05F 1/56 |
| | | | 323/274 |
| 2010/0289472 A1* | 11/2010 | Renous | G05F 1/575 |
| | | | 323/282 |
| 2011/0248693 A1* | 10/2011 | Karnik | G05F 1/575 |
| | | | 323/280 |
| 2012/0176107 A1* | 7/2012 | Shrivas | G05F 1/575 |
| | | | 323/271 |
| 2012/0326694 A1* | 12/2012 | Sessions | G05F 1/575 |
| | | | 323/312 |
| 2013/0113447 A1* | 5/2013 | Kadanka | G05F 1/563 |
| | | | 323/280 |
| 2013/0285630 A1* | 10/2013 | Wang | G05F 1/562 |
| | | | 323/275 |
| 2014/0285165 A1* | 9/2014 | Wang | G05F 1/575 |
| | | | 323/274 |
| 2015/0008871 A1* | 1/2015 | Petenyi | H02H 7/1213 |
| | | | 323/270 |
| 2015/0035505 A1* | 2/2015 | Peluso | G05F 1/465 |
| | | | 323/273 |
| 2015/0137781 A1* | 5/2015 | Qu | G05F 1/56 |
| | | | 323/280 |
| 2016/0091909 A1* | 3/2016 | Olejarz | G05F 1/56 |
| | | | 323/280 |
| 2016/0098050 A1* | 4/2016 | Enjalbert | G05F 1/575 |
| | | | 323/280 |
| 2016/0173066 A1* | 6/2016 | Yang | H03K 19/01714 |
| | | | 327/109 |
| 2016/0291619 A1* | 10/2016 | Guan | G05F 1/56 |
| 2017/0097649 A1* | 4/2017 | Lee | G09G 3/3696 |
| 2017/0199537 A1* | 7/2017 | Duong | G05F 1/575 |
| 2017/0212540 A1* | 7/2017 | Cho | H03K 5/1534 |
| 2018/0046211 A1* | 2/2018 | Vilas Boas | G05F 1/575 |
| 2018/0241305 A1* | 8/2018 | Chang | G05F 1/56 |
| 2018/0259987 A1 | 9/2018 | Yang | |
| 2019/0064862 A1* | 2/2019 | Pan | G05F 1/561 |
| 2019/0079551 A1* | 3/2019 | Tourret | G05F 1/575 |
| 2019/0107856 A1* | 4/2019 | Lim | G05F 1/59 |
| 2019/0113942 A1 | 4/2019 | Murukumpet et al. | |
| 2019/0220049 A1* | 7/2019 | Qiu | H03F 3/45 |
| 2019/0265739 A1* | 8/2019 | Kuroda | H03F 3/45192 |
| 2020/0081469 A1* | 3/2020 | Dooghabadi | G05F 1/565 |
| 2020/0144913 A1* | 5/2020 | Harjani | G05F 1/565 |
| 2020/0333815 A1* | 10/2020 | Shankar | G05F 1/56 |
| 2021/0026385 A1* | 1/2021 | Park | G05F 1/575 |
| 2021/0124383 A1* | 4/2021 | Iguchi | G05F 1/565 |
| 2021/0149422 A1* | 5/2021 | Perez | G05F 1/575 |
| 2021/0149426 A1* | 5/2021 | Kim | G05F 1/56 |
| 2021/0247793 A1* | 8/2021 | Hashemi | G06F 1/26 |
| 2021/0365060 A1* | 11/2021 | Chang | G05F 1/575 |
| 2022/0019253 A1* | 1/2022 | Zukowski | G05F 1/468 |
| 2022/0066492 A1* | 3/2022 | Lin | H02M 1/0029 |
| 2022/0107675 A1* | 4/2022 | Kim | G06F 1/04 |
| 2022/0300021 A1* | 9/2022 | Gwon | G05F 1/575 |
| 2022/0329060 A1* | 10/2022 | Serpedin | G05F 1/56 |
| 2022/0350354 A1* | 11/2022 | D'Souza | H04B 1/40 |
| 2022/0350356 A1* | 11/2022 | D'Souza | G05F 1/565 |
| 2022/0351756 A1* | 11/2022 | Chuang | G05F 3/262 |
| 2022/0352818 A1* | 11/2022 | D'Souza | H02M 3/156 |
| 2022/0360259 A1* | 11/2022 | Hou | H03K 17/163 |

OTHER PUBLICATIONS

Ameziane, H. et al. "An enhancement transient response of capless LDO with improved dynamic biasing control for SoC applications", IEEE 2015 27th International Conference on Microelectronics, 4 pgs. (Dec. 2015).

Kampus, V. et al. "A smart capless voltage regulator for very high bandwidth A/D and D/A converters in a standard 28nm CMOS process", IEEE 2016 15th Biennial Baltic Electronics Conference, 4 pgs. (Oct. 2016).

Yun, S. J. et al. "Capless LDO Regulator Achieving—76 dB PSR and 96.3 fs FOM", IEEE Transactions on Circuits and Systems II: Express Briefs, vol. 64, No. 10, 5 pgs. (Oct. 2017).

Magod, R. et al. "A 1.24 µA Quiescent Current NMOS Low Dropout Regulator With Integrated Low-Power OscillatorDriven Charge-Pump and Switched-Capacitor Pole Tracking Compensation", IEEE Journal of Solid-State Circuits, vol. 53, No. 8, pp. 2356-2367 (Aug. 2018).

Santra, A. et al. "A Power Efficient Output Capacitor-Less LDO Regulator with Auto-Low Power Mode and Using Feed-Forward Compensation", IEEE 2019 32nd International Conference on VLSI Design and 2019 18th International Conference on Embedded Systems, 5 pgs., (Jan. 2019).

Santra, A. et al. "A Highly Scalable, Time-Based Capless Low-Dropout Regulator Using Master-Slave Domino Control", IEEE 2019 International Symposium on Circuits and Systems, 4 pgs. (May 2019).

Delshadpour, S. et al. "A BMC Analog/Digital PHY for Type-C USB Power Delivery Chip in 0.14 µm CMOS Technology", IEEE Canadian Conference of Electrical and Computer Engineering, 4 pgs. (May 2019).

\* cited by examiner

CAPLESS LOW DROPOUT REGULATION

BACKGROUND

Universal Serial Bus (USB) devices that communicate with a host over USB include USB printers, scanners, digital cameras, storage devices, card readers, and the like. USB based systems may require that a USB host controller be present in the host system, and that the operating system (OS) of the host system support USB and USB Mass Storage Class Devices. USB2 devices may communicate over the USB bus at low speed (LS), full speed (FS), or high speed (HS). A connection between a USB device and a host may be established via a four wire interface that includes a power line, a ground line, and a pair of data line, differential voltage plus (D+) and differential voltage minus (D−), or for the case of USB On-The-Go (OTG), a fifth line named ID (identification pin) may be added. When a USB device connects to the host, the USB device may first pull a D+ line high (or the D− line if the device is a low speed device) using a pull up resistor on the D+ line when connecting as FS (Full Speed) mode. The host may respond by resetting the USB device. If the USB device is a high-speed USB device, the USB device may "chirp" by driving the D− line high during the reset. The host may respond to the "chirp" by alternately driving the D+ and D− lines high. The USB device may then electronically remove the pull up resistor and continue communicating at high speed if both communicating devices are HS capable. Disconnection at high-speed happens when a cable is removed and HS RX terminal on USB device is removed. It results in doubling HS amplitude on the USB host transmitter. The USB2 specification defines a mechanism to detect differential line voltage using differential difference receiver detectors.

The success of USB2.0 technology has enjoyed wide adoption in almost every computing device, with tremendous ecosystem support not only in terms of device choice to support various platform features, but also in terms of technology development with well-established hardware IP portfolios and standardized software infrastructure. It is foreseeable that the great asset of USB2.0 technology will continue to benefit the ecosystem for years to come. As power efficiency becomes increasingly critical in today's computing devices, there is a need for IO technology to be optimized for both active and idle power. USB2.0 technology, originally optimized for external device interconnect, is primed to be enhanced for inter-chip interconnect such that the link power can be further optimized. Meantime, silicon technology continues to scale. Device dimensions are getting smaller and therefore more devices can be packed onto a single integrated chip. However, the device reliability challenge arising from the densely packed transistors has become more profound.

At system level, eUSB2 to USB2.0 bridge (eUSB2 repeater) is required to support host communication to external USB2.0 compliant devices via USB connectors. eUSB2 typically works at 1.2V. However, typically, a system on chip (SoC) includes 1.8V and 3.3V power sources. A DC-to-DC converter may be used to convert 1.8V to 1.2V. However, this converter is not power and/or area efficient, takes more space on the chip and generates noise. Other solutions using low dropout (LDO) regulators are available but these solutions do not provide the regulated output voltage variations within a predefined range and are not fast enough to track the output load quickly and making it fast has power penalty. A large capacitor at output node of the LDO will help for the fast changing load, but it brings silicon area penalty or need a dedicated pin and an external capacitor which makes it an expensive solution.

SUMMARY

In one embodiment, circuit for converting a first voltage to a second voltage in a communication system is disclosed. The circuit includes a pass transistor including a first terminal, a second terminal and a gate, wherein the first terminal is coupled with the first voltage. The circuit is also includes an error amplifier. The error amplifier includes a first input that is coupled with a constant reference voltage and a second input that is coupled with a first switch that is coupled with an output port. A second switch is included and is coupled between the first voltage and an output of the error amplifier. The output of the error amplifier is coupled with the gate of the pass transistor. A third switch is included and is coupled between ground and the output of the error amplifier. The second switch is configured to be driven by a first one shot pulse generated from an input signal of the communication system and the third switch is configured to be driven by a second one shot pulse generated from the input signal.

In some examples, the constant reference voltage is generated by a bandgap reference voltage generator and the value of the constant reference voltage is equal to the second voltage. The first one shot pulse is generated at a rising edge of the input signal and the second one shot pulse is generated at a falling edge of the input signal. The first one shot pulse and the second one shot pulse have configurable widths that may be the same or different from each other. The second switch is configured to pull up a voltage at the gate of the pass transistor during the configurable width of the first one shot pulse and the second switch is configured to pull down a voltage at the gate of the pass transistor during the configurable width of the second one shot pulse by coupling the gate of the pass transistor to ground. The first one shot pulse may be generated by a one shot pulse generator by inputting the input signal to the one shot pulse generator and the second one shot pulse may be generated by a one shot pulse generator by inputting an inverse of the input signal to the one shot pulse generator. The first switch is driven by the input signal and is configured to connect or disconnect a load from the output port.

In another embodiment, a method for converting a first voltage to a second voltage in a system is disclosed. The method includes comparing an output voltage with a constant reference voltage using an error amplifier and generating a driving voltage to drive a pass transistor to bring the output voltage equal to the second voltage. The method further includes generating a first one shot pulse from an input signal of the system and generating a second one shot pulse from the input signal of the system. The method also includes pulling up the driving voltage during a width of the first one shot pulse and pulling down the driving voltage during a width of the second one shot pulse.

BRIEF DESCRIPTION OF THE DRAWINGS

Throughout the description, similar reference numbers may be used to identify similar elements.

DETAILED DESCRIPTION

Figure 1:
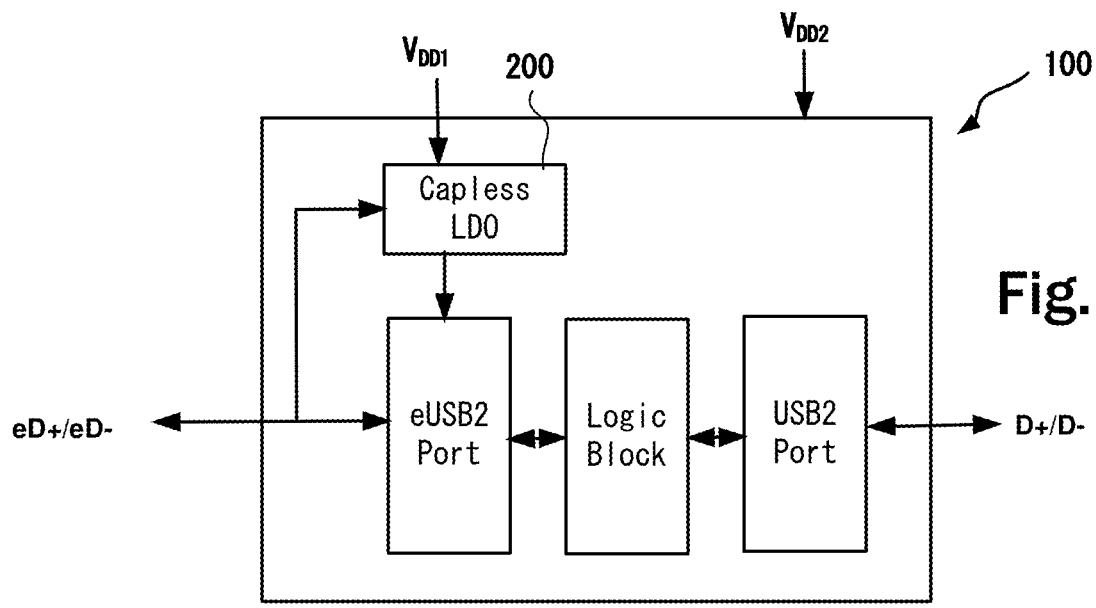
FIG. 1 illustrates a bidirectional eUSB2/USB2 repeater including a capless low dropout (LDO) regulator in accordance with one or more embodiments of the present disclosure.

It will be readily understood that the components of the embodiments as generally described herein and illustrated in the appended FIGS. could be arranged and designed in a wide variety of different configurations. Thus, the following more detailed description of various embodiments, as represented in the FIGS., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Traditional low dropout (LDO) regulators are simple to design and provide good regulated output, but are area consuming and usually need off-chip capacitors which increase the overall component count and need a dedicated pin. Capless LDO regulators are attractive due to their small area footprints and they don't require an off-chip capacitor. The embodiments described herein provide a capless LDO regulator which is suitable for a variable load of $I_{MAX}/I_{MIN}$ (e.g., 10 mA/0 mA). The capless LDO regulator uses simple one-shot circuit with pull-up/pull-down switches to partially adjust output voltage variation during $I_{MAX}/I_{MIN}$ transition. Typical LDO regulator generally use a feedback loop to sense the output voltage and are configured to adjust the output voltage through the feedback loop. However, the embodiments of a capless LDO regulator described herein do not use a feedback loop to adjust the output voltage. The capless LDO regulator uses a one-shot circuit for (that uses positive and negative edges of to be transmitted input signal) a quick adjustment of the output voltage when load changes by switching a pass transistor. It should be noted that even though the capless LDO regulator is described herein in the context of a eUSB2/USB2 repeater, the introduced capless LDO regulator may be used in other applications that requires a voltage conversion from a first voltage to a second voltage with a fast tracking of load changes.

FIG. 1 shows a block diagram of a bidirectional eUSB2/USB2 repeater 100 including a low dropout (LDO) regulator 200. The eUSB2/USB2 repeater 100 may be housed in a system on chip (SOC). In one example, the SoC provides two voltage sources $V_{DD1}$ and $V_{DD2}$. $V_{DD1}$ may be 1.8V and $V_{DD2}$ may be 3.3V. USB2 typically works on 3.3V and eUSB2 operates on 1.2V. If the SoC does not provide a 1.2V source, 1.2V needs to be generated for eUSB2. For efficiency reasons, 1.2V is generated from 1.8V source than 3.3V source.

The eUSB2/USB2 repeater 100 includes a eUSB2 port that outputs eD+/eD− signals and a USB2 port that outputs D+/D− signals. A logic block is coupled between the eUSB2 port and the USB2 port. The operations of these two ports and the switch are known to a person skilled in the art. A capless LDO 200 is included to convert $V_{DD1}$ to a voltage different from $V_{DD1}$. In this example, the capless LDO 200 may convert 1.8V to 1.2V. However, the capless LDO may also be used for converting other voltage values if needed. The capless LDO 200 provides advantages over a typical solution because the capless LDO does not require an additional external capacitor or large internal capacitor and the capless LDO provides a fast tracking of load changes so that the output signal's rise and fall time improves. The capless LDO 200 also removes a need for a 1.2V input port or pin.

Figure 2A:
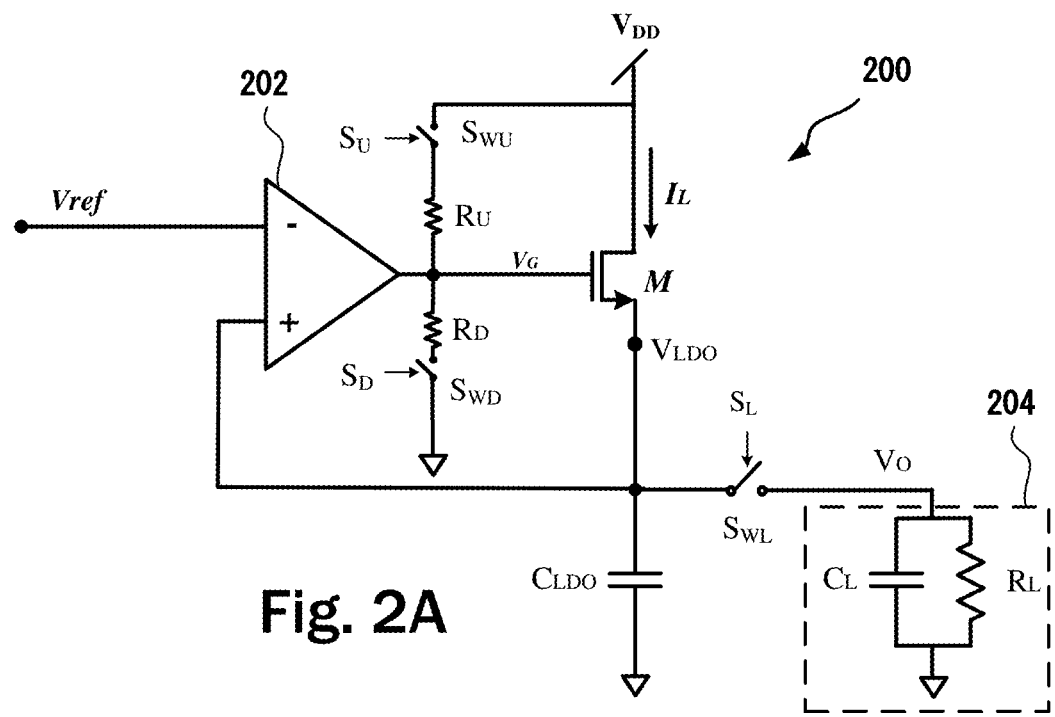
FIG. 2A illustrates the internal circuit of the capless LDO regulator in FIG. 1 in accordance with one or more embodiments of the present disclosure.

FIG. 2A illustrates the internal circuit of the LDO regulator 200. The LDO regulator 200 includes an error amplifier 202 that receives a reference voltage Vref. Vref may be generated using a bandgap voltage reference circuit (not shown). A bandgap voltage reference is an on-chip reference with minimum variation. It produces a fixed (constant) voltage regardless of power supply variations, temperature changes, or circuit loading from a device (with some acceptable variation depending on the system requirement and design). Vref should be the same or substantially same to the required output voltage. For example, if the capless LDO regulator 200 is configured to convert 1.8V to 1.2V, Vref should be 1.2V. The capless LDO regulator 200 is configured to keep the output voltage equal to Vref. The load 204 may be a component external to the capless LDO regulator 200. The load has an impedance $Z_L$ that may include $C_L$ and $R_L$. In the example of FIG. 1, the load 204 may be the eUSB2 port.

The capless LDO regulator 200 includes a pass transistor M that allows the current $I_L$ from a power source $V_{DD}$ to pass through it when it is conducting. The capless LDO regulator 200 converts $V_{DD}$ to $V_{LDO}$. A (fairly small) capacitor $C_{LDO}$ coupled with the first terminal of the pass transistor M is included. The second terminal of the pass transistor M is coupled with the voltage source $V_{DD}$. The other end of the capacitor $C_{LDO}$ is coupled with ground. $V_{LDO}$ represents the voltage at the first terminal of the pass transistor M. The rising and falling edges of $V_{LDO}$ should be rise and fall fast as close to the ideal square wave signal as possible. When $S_{WL}$ is enabled, the rising edge of the signal $S_L$, the load $Z_{LDO}$ (e.g., the impedance of the capacitor $C_{LDO}$ in parallel with $Z_L=C_L||R_L$) sinks current from pass transistor of the LDO, but since $Z_L$ is small at the beginning (due to $C_L$), $V_{LDO}$ drops and $V_G$ drops too. It takes some time for the OTA to adjust $V_G$ since it doesn't have enough juice to charge the effective cap at the gate of the pass transistor M.

Figure 2B:
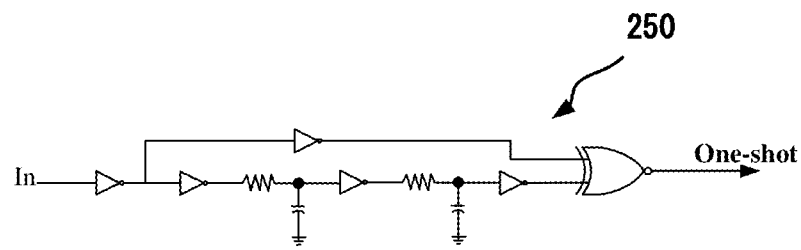
FIG. 2B shows an example of a one shot generator circuit to be used with the internal circuit of the LDO regulator of FIG. 2.

The capless LDO regulator 200 includes a switch $S_{WU}$ coupled with a resistor $R_U$ at the output of the error amplifier 202. The switch $S_{WU}$ is controlled by a signal $S_U$. The signal $S_U$ may be generated using a one shot circuit 250 shown in FIG. 2B. The one shot signal is generated from the input signal $S_L$ (the signal being transmitted) at the rising edge of the input signal. A one shot circuit is well known in the art, hence a detailed discussion is being omitted. A switch $S_{WD}$ is included and is coupled with a resistor RD. The switch $S_{WD}$ is driven by a signal $S_D$. The signal $S_D$ is a one shot signal that is generated at the falling edge of the input signal, that is the inverse of the input signal may be inputted to the one shot circuit 250 to generate the signal $S_D$. The resistor $R_D$ is coupled with the output of the error amplifier 202. The output of the error amplifier 202 provides the voltage $V_G$ to drive the gate of the pass transistor M. A switch $S_{WL}$ is included at the output of the capless LDO 200. The switch $S_{WL}$ is driven by the input signal $S_L$. In one example, the switch $S_{WU}$ may be of type N or NMOS and the switch $S_{WD}$ may be of type P or PMOS. The switch $S_{WU}$ needs to be of different type (e.g., NMOS or PMOS) than the switch $S_{WD}$.

The one shot signals $S_U$ and $S_D$ turns on the switches $S_{WU}$ and $S_{WD}$ at rising and falling edges respectively to lift $V_G$ that would otherwise fall during the rising and falling edges. This boost in $V_G$ at the rising and falling edges results in faster rising and falling edges of the output voltage $V_O$. The switches $S_{WU}$ and $S_{WD}$ turns on only for the duration of the one shot pulse (which may be adjusted to adjust rising and falling edges slops), the current path including the switches $S_{WU}$ and $S_{WD}$ remains disconnected during the input signal pulse width other than for a period equal to the width of the one shot pulse at the rising and falling edges. Hence, the introduction of the current path including the switches $S_{WU}$ and $S_{WD}$ does not cause any significantly additional consumption of power.

The value of the resistor $R_U$ can be as close to 0 as possible to prevent the resistor $R^U$ from limiting the current flow significantly to prevent connecting $V_G$ to $V_{DD}$. The value of $R_U$ may be calculated based on specific application requirement to achieve a desired output voltage characteristics (e.g., optimized rising and falling edges). In some examples, the value of $R_U$ may be programmable or trimmable so that the value of $R_U$ may be set or changed at run time. Similarly, to enable the error amplifier 202 to provide fast tracking of the input signal, the width of the one shot pulse may be programmable to allow an optimization of the output voltage characteristics at run time. At the falling edge of signal $S_L$, the switch $S_{WL}$ will be shut down, then already flowing $I_L$ will see an impedance increase ($C_{LDO}||Z_L<C_{LDO}$, $Z_L$ is the impedance of the load 204) that causes $V_G$ and $V_{LDO}$ to spike for a short period of time. Practically, the error amplifier 202 is not fast enough to adjust $V_G$. The $S_D$ signal that is generated by negative edge of the input signal $S_L$, by the one-shot circuit 250 enables the switch $S_{WD}$ for the duration of the one shot pulse and pulls $V_G$ down to cause $V_{LDO}$ to drop until the error amplifier 202 reacts to the falling edge of the input signal $S_L$. The resistor $R_D$ may be high enough to prevent connecting $V_G$ to ground during the falling edge. The use of one shot pulse to boost and pulldown $V_G$ during rising and falling edges respectively provides a significantly stable $V_O$ between load changes.

Figure 3:
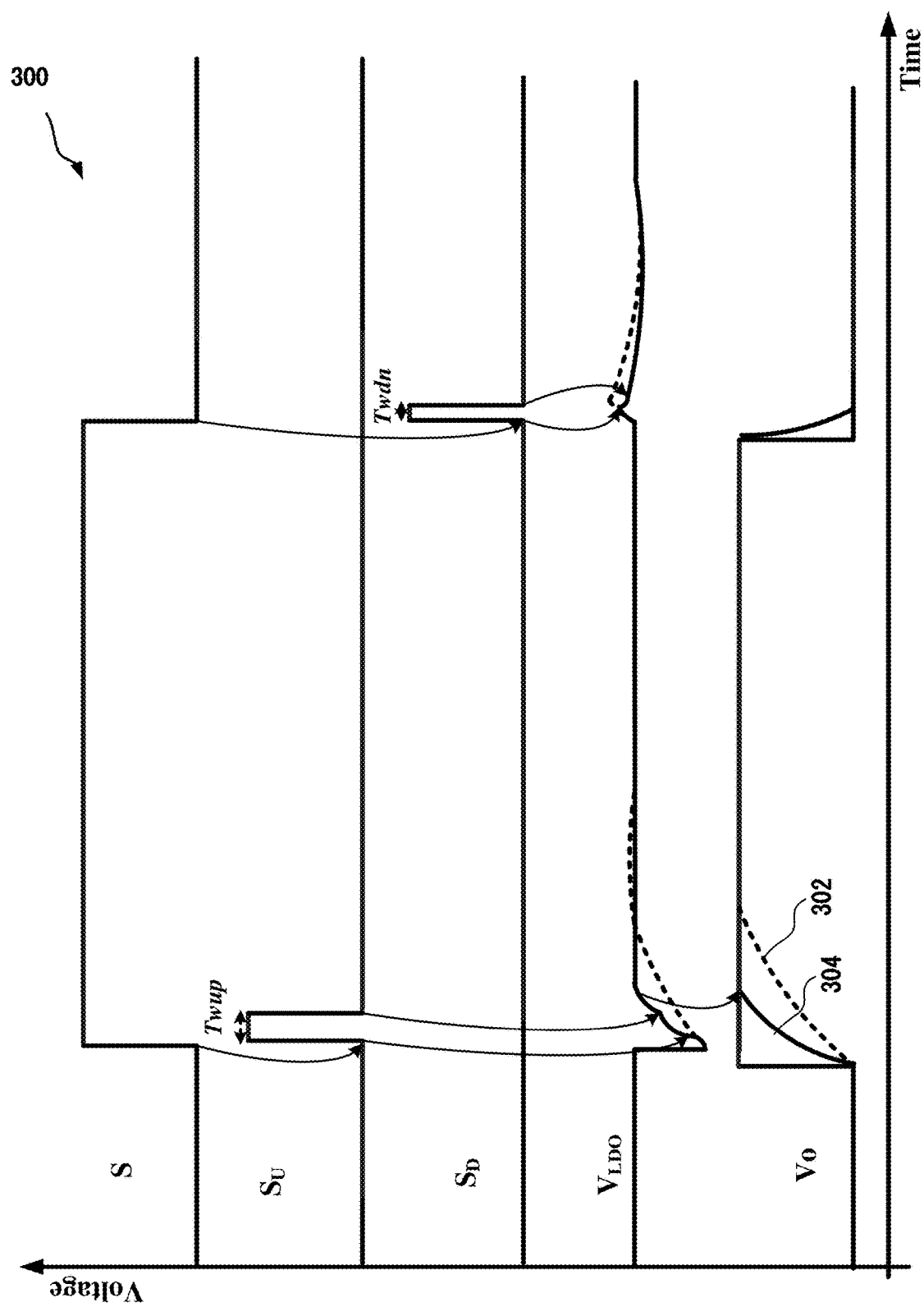
FIG. 3 shows the output characteristics of the capless LDO regulator of FIG. 2.

FIG. 3 shows the voltage-time waveforms 300 and output characteristics of the capless LDO regulator 200. As shown, at the rising edge of the input signal $S_L$, a one shot pulse signal $S_U$ is generated using a one shot circuit which may be the one shot circuit 250 or any other type of known one shot pulse circuit. The one shot pulse has a configurable or programmable duration $T_{wup}$. The switch $S_{WU}$ remains on during the duration $T_{wup}$ and that causes a boost in $V_G$ during the duration $T_{wup}$. The boost in $V_G$ pulls up $V_{LDO}$ faster than it could rise without the one shot pulse. The faster pull up of $V_{LDO}$ causes the output voltage $V_O$ also rises faster (e.g., the curve 304) than it would have been without the signal $S_U$ (e.g., the curve 302). At the falling edge, the one shot pulse (e.g., the signal $S_D$) is generated at the falling edge of the input signal $S_L$. The falling edge one shot pulse has the configurable or programmable width $T_{wdn}$. As explained above, the falling edge one shot pulse causes a faster pull down of the capacitor $C_{LDO}$ and as shown, thus causing the spike in $V_{LDO}$ to be smaller compared to the spike without the falling edge one shot pulse.

Figure 4:
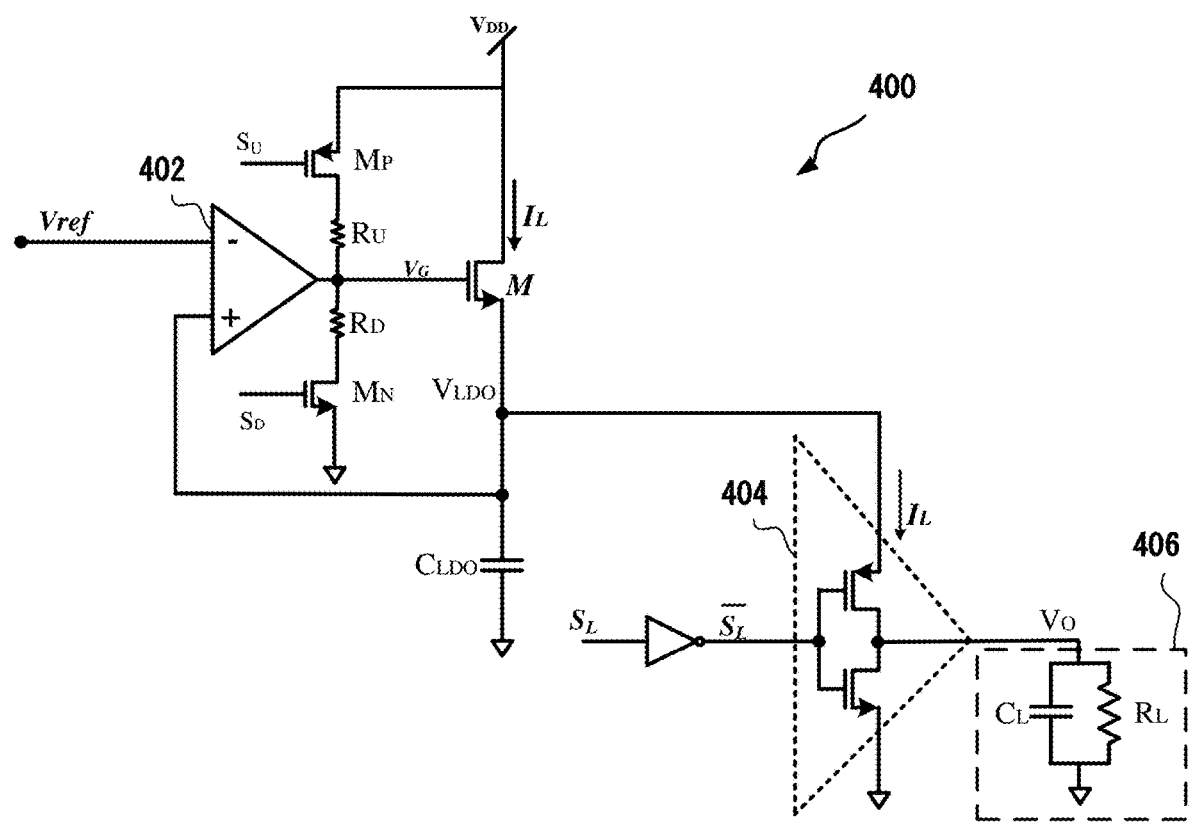
FIG. 4 illustrates another example of the internal circuit of the LDO regulator in FIG. 1 in accordance with one or more embodiments of the present disclosure.

FIG. 4 illustrates an example implementation of the internal circuit of the capless LDO regulator 400. The capless LDO regulator 400 includes an error amplifier 402 and coupled with a load 406. The capless LDO regulator 400 functions the same manner as the capless LDO regulator 200. In one example, the switch $S_{WU}$ may be implemented using a PMOS transistor $M_P$ and the switch $S_{WD}$ may be implemented using a NMOS switch $M_N$. And the switch $S_{WL}$ may be implemented using a transmitter driver 404 including at least two transistors of different types (e.g., NMOS and PMOS). The gates of the transistors of the transistor pairs are driven by the input signal $S_L$ (or an inverse of the input signal $S_L$ depending on the configuration of the differential transistor pair or the TX driver 404).

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit for converting a first voltage to a second voltage in a communication system, comprising:
   a pass transistor including a first terminal, a second terminal and a gate, wherein the first terminal is coupled with the first voltage;
   an error amplifier including a first input that is coupled with a constant reference voltage and a second input that is coupled with a first switch that is coupled with an output port;

a second switch coupled between the first voltage and an output of the error amplifier, wherein the output of the error amplifier is coupled with the gate of the pass transistor;

a third switch coupled between ground and the output of the error amplifier; and wherein the second switch is configured to be driven by a first one shot pulse generated from an input signal of the communication system and the third switch is configured to be driven by a second one shot pulse generated from the input signal, wherein the first switch is driven by the input signal and is configured to connect or disconnect a load from the output port.

2. The circuit of claim 1, wherein the constant reference voltage is generated by a bandgap reference voltage generator.

3. The circuit of claim 1, wherein a value of the constant reference voltage is equal to the second voltage.

4. The circuit of claim 1, wherein the first one shot pulse is generated at a rising edge of the input signal.

5. The circuit of claim 1, wherein the second one shot pulse is generated at a falling edge of the input signal.

6. The circuit of claim 1, wherein the first one shot pulse has a configurable width.

7. The circuit of claim 1, wherein the second one shot pulse has a configurable width.

8. The circuit of claim 6, wherein the second switch is configured to pull up a voltage at the gate of the pass transistor during the configurable width of the first one shot pulse.

9. The circuit of claim 7, wherein the third switch is configured to pull down a voltage at the gate of the pass transistor during the configurable width of the second one shot pulse by coupling the gate of the pass transistor to ground.

10. The circuit of claim 1, wherein the first one shot pulse is generated by a one shot pulse generator by inputting the input signal to the one shot pulse generator.

11. The circuit of claim 1, wherein the second one shot pulse is generated by a one shot pulse generator by inputting an inverse of the input signal to the one shot pulse generator.

12. A method for converting a first voltage to a second voltage in a system, the method comprising:

comparing an output voltage with a constant reference voltage using an error amplifier and generating a driving voltage to drive a pass transistor to bring the reference voltage equal to the second voltage;

generating a first one shot pulse from an input signal of the system;

generating a second one shot pulse from the input signal of the system;

pulling up the driving voltage during a width of the first one shot pulse;

pulling down the driving voltage during a width of the second one shot pulse; and connecting or disconnecting a load from an output port which outputs the output voltage based on the input signal.

13. The method of claim 12, wherein a value of the constant reference voltage is equal to the second voltage.

14. The method of claim 12, wherein the first one shot pulse is generated at a rising edge of the input signal.

15. The method of claim 12, wherein the second one shot pulse is generated at a falling edge of the input signal.

16. The method of claim 12, wherein the width of the first one shot pulse is configurable or programmable.

17. The method of claim 12, wherein the width of the second one shot pulse configurable or programmable.

18. The method of claim 12, wherein the width of the first one shot pulse is equal to the width of the second one shot pulse.

19. The method of claim 12, wherein the width of the first one shot pulse is different from the width of the second one shot pulse.

* * * * *